US009693417B2

(12) United States Patent
Knoedgen et al.

(10) Patent No.: US 9,693,417 B2
(45) Date of Patent: Jun. 27, 2017

(54) LED MAINS VOLTAGE MEASUREMENT USING A CURRENT MIRROR

(71) Applicant: Dialog Semiconductor GmbH, Kirchheim/Teck-Nabern (DE)

(72) Inventors: Horst Knoedgen, Munich (DE); Julian Tyrrell, Swindon (GB); Hidenori Kobayashi, Kawasaki (JP)

(73) Assignee: Dialog Semiconductor (UK) Limited, London (GB)

( * ) Notice: Subject to any disclaimer, the term of this patent is extended or adjusted under 35 U.S.C. 154(b) by 225 days.

(21) Appl. No.: 14/596,459

(22) Filed: Jan. 14, 2015

(65) Prior Publication Data

US 2015/0382429 A1 Dec. 31, 2015

(30) Foreign Application Priority Data

Jun. 26, 2014 (EP) .................................... 14174562

(51) Int. Cl.
- *G01R 31/00* (2006.01)
- *H05B 33/08* (2006.01)
- *G01R 19/00* (2006.01)
- *G01R 19/155* (2006.01)

(52) U.S. Cl.
CPC ..... *H05B 33/0887* (2013.01); *G01R 19/0084* (2013.01); *G01R 19/155* (2013.01); *H05B 33/0809* (2013.01); *H05B 33/0845* (2013.01); *H05B 33/0815* (2013.01)

(58) Field of Classification Search
CPC ............ H05B 33/0887; H05B 33/0809; H05B 33/0845; G01R 19/0084; G01R 19/155
See application file for complete search history.

(56) References Cited

U.S. PATENT DOCUMENTS

| | | | | |
|---|---|---|---|---|
| 6,479,975 | B1 * | 11/2002 | Plankensteiner | G01R 19/16519 323/313 |
| 2002/0190779 | A1 | 12/2002 | Aiba et al. | |
| 2008/0164948 | A1 * | 7/2008 | Pelli ........................ | H03F 3/343 330/288 |

(Continued)

OTHER PUBLICATIONS

European Search Report 14174562.0-1802, Jan. 22, 2015, Dialog Semiconductor (UK) Limited.

(Continued)

*Primary Examiner* — Daniel Miller
(74) *Attorney, Agent, or Firm* — Saile Ackerman LLC; Stephen B. Ackerman (57) ABSTRACT

Measurement circuits which are configured to measure wide ranges of the input voltage using a sensed input voltage of the driver circuits for solid state lighting (SSL) devices are presented. The measurement circuit comprises a first resistor which is coupled at a first side to the input voltage. The measurement circuit comprises current mirror circuitry coupled at an input to a second side of the first resistor, and which translates an input current at the input of the current mirror circuitry into an output current at an output of the current mirror circuitry, such that the output current is proportional to the input current by a current mirror ratio. The measurement circuit comprises a second resistor coupled to the output of the current mirror circuitry and to provide the sensed input voltage, when the input voltage is coupled to the first side of the first resistor.

24 Claims, 8 Drawing Sheets

(56) References Cited

U.S. PATENT DOCUMENTS

2011/0157109 A1\* 6/2011 Svajda ............... H05B 33/0815
   345/205
2013/0342125 A1 12/2013 Eom et al.
2015/0115900 A1\* 4/2015 Ananth ................. G01R 15/08
   320/166

OTHER PUBLICATIONS

"Zetex SM-8 Complementary Current Mirror, ZDS1009," Jan. 31, 2000, pp. 1-5, XP055162433, Retrieved from the Internet: URL:http://www.diodes.com/datasheets/ZDS1009.pdf.

\* cited by examiner

LED MAINS VOLTAGE MEASUREMENT USING A CURRENT MIRROR

TECHNICAL FIELD

The present document relates to measurement circuits to be used e.g. in solid state lighting (SSL) devices. In particular, the present document relates to measurement circuits which are configured to measure wide ranges of the input voltage of the driver circuits for SSL devices.

BACKGROUND

Solid State Lighting (SSL) light bulb assemblies, e.g. Light Emitting Diode (LED) based light bulb assemblies, are currently replacing GLS (General Lighting Service) or incandescent lamps. SSL devices typically comprise a driver circuit and/or power converter in order to convert electric power from a mains supply to electric power suitable for an SSL light source comprised within the SSL device (e.g. an array of LEDs).

The driver circuit for an SSL device may be configured to convert the AC mains voltage into a possibly constant load voltage and a load current. In particular, the driver circuits may be configured to control the load voltage (also referred to as the drive voltage) and the load current (also referred to as the SSL current) such that the SSL device emits flicker-free light.

SSL devices may be used in conjunction with mains voltages at different levels (e.g. 110V or 230V). It may be beneficial to use the same driver circuit for such different mains voltage levels. Furthermore, it may be beneficial to provide an accurate digital version of the waveform of the mains voltage, e.g. in order to be able to reliably demodulate information which may be modulated onto the waveform of the mains voltage (e.g. for dimming purposes).

SUMMARY

The present document addresses the technical problem of providing a measurement circuit, notably for the driver circuit of an SSL device, which allows for an accurate measurement of an input voltage (notably the input voltage of a driver circuit) across a wide range of voltage values. According to an aspect, a measurement circuit is described, which is configured to provide a sensed input voltage indicative of an input voltage. The measurement circuit may be implemented as part of a driver circuit for a solid state lighting (SSL) device, in order to provide accurate measurements of the input voltage to the driver circuit (notably in a digital manner). Such accurate measurements may e.g. be beneficial to derive dim level control information from the input voltage (notably dim level control information which may be modulated onto the waveform of the input voltage).

The measurement circuit comprises a first resistor which is configured to be coupled at a first side to the input voltage. Furthermore, the measurement circuit comprises current mirror circuitry which is coupled at an input of the current mirror circuitry to a second side of the first resistor, wherein the second side of the first resistor is opposite to the first side of the first resistor. As such, the first resistor and the current mirror circuitry may be implemented in series with respect to one another. In example configurations, the input of the current mirror circuitry may be coupled directly to the second side of the first resistor. The first resistor may correspond to the upper resistor of a voltage divider.

The current mirror circuitry is configured to translate an input current at the input of the current mirror circuitry into an output current at an output of the current mirror circuitry, such that the output current is proportional to the input current by a current mirror ratio. If the current mirror ratio is greater than one, the current mirror circuitry may be configured to amplify the input current to provide an output current which exceeds the input current by a factor corresponding to the current mirror ratio. On the other hand, if the current mirror ratio is smaller than one, the current minor circuitry may be configured to attenuate the input current to provide an output current which is smaller than the input current by a factor corresponding to the current mirror ratio. In an example configuration, the input current of the current mirror circuitry corresponds to the current through the first resistor.

The measurement circuit comprises a second resistor coupled to the output of the current mirror circuitry. The second resistor is configured to provide the sensed input voltage, when the input voltage is coupled to the first side of the first resistor. In particular, the sensed input voltage may depend on (or may correspond to) a voltage drop at the second resistor. For this purpose, the current through the second resistor may correspond to the output current of the current mirror circuitry.

As such, the measurement circuit may comprise a modified voltage divider which makes use of current mirror circuitry to adjust the voltage divider ratio. In order to provide varying voltage divider ratios, the current mirror ratio may be adjustable. Using the current mirror circuitry, the measurement circuit may be adapted to different levels of input voltages. In particular, the current mirror circuitry (notably the current mirror ratio) may be adjusted such that the sensed input voltage remains within a pre-determined range (given e.g. by an analog-to-digital converter, ADC) for different ranges of input voltages. By way of example, if the input voltage changes to a range which is K times (e.g. 2 times) higher/lower than a previous range, the current mirror ratio may be adjusted by the same factor K (increased or decreased), in order to ensure that the range of the sensed input voltage remains unchanged.

The measurement circuit may comprise control circuitry configured to determine a level or range of the input voltage. The control circuitry may then be configured to adapt the current mirror ratio, in dependence of the determined level or range of the input voltage. In particular, the control circuitry may be configured to adjust the current mirror ratio such that a level or range of the sensed input voltage is maintained at a pre-determined level or range, regardless the level or range of the input voltage.

The current mirror circuitry may comprise a current mirror with an input transistor, an output transistor, an auxiliary transistor, and an auxiliary switch. The auxiliary transistor may be arranged in series with the auxiliary switch. The serial arrangement of the auxiliary switch and the auxiliary transistor may be arranged in parallel to the input transistor or to the output transistor, when the auxiliary switch is closed. The measurement circuit (notably the control circuitry of the measurement circuit) may be configured to control the auxiliary switch to adjust the current mirror ratio. Hence, by using one or more auxiliary transistors which may be arranged in parallel to the input transistor or to the output transistor of a current mirror, the current mirror ratio of the current mirror circuitry may be adjusted in a flexible and cost effective manner. In particular, this scheme for adjusting the current mirror ratio may be implemented within an integrated circuit.

The measurement circuit may further comprise an offset current source configured to provide an offset current. The input current at the input of the current mirror circuitry may be dependent on a current through the first resistor and on the offset current. In particular, the current through the first resistor (which is indicative of the input voltage) may be offset using the offset current. By way of example, the input current to the current mirror circuitry may correspond to the sum of the offset current and the current through the first resistor. As a result of this, the sensed input voltage may be offset. This may be beneficial to adjust (notably to offset) a to-be-measured range of the input voltage to a pre-determined range of the sensed input voltage (which may e.g. be digitized using an analog-to-digital converter).

The current mirror circuitry may comprise a first current mirror which is configured to translate the input current into an intermediate current using a first ratio. Furthermore, the current mirror circuitry may comprise a second current mirror configured to translate the intermediate current into the output current using a second ratio. As outlined above, the first and/or second current mirrors may be adjustable using one or more auxiliary transistors, respectively. The current mirror ratio depends on the first ratio and on the second ratio, e.g. on the product of the first ratio and the second ratio. The first current mirror may comprise n-type metal oxide semiconductor (MOS) transistors, and the second current mirror comprises p-type metal oxide semiconductor transistors.

The use of two current mirrors which are arranged in series is beneficial in order to provide a sensed input current at the second resistor, which is related to ground. A second side of the second resistor may be (directly) coupled to ground and a first side of the second resistor may be (directly) coupled to the output of the current mirror circuitry. As a result of this, the current through the second resistor may correspond to the output current of the current mirror circuitry. The sensed input voltage may then be provided as the voltage level at the first side of the second resistor (relative to ground).

The measurement circuit may further comprise a source follower circuit which is arranged between the second side of the first resistor and the input of the current mirror circuitry. The source follower circuit may be configured to set a voltage level of the second side of the first resistor to a pre-determined reference voltage. This may be beneficial for stabilizing the measurement circuit (e.g. subject to transients/spikes of the input voltage).

The source follower circuit may comprise a source follower transistor (e.g. a p-type MOS transistor) arranged between the second side of the first resistor and the input of the current mirror circuitry. A source-drain current of the source follower transistor may correspond to the current through the first resistor. Furthermore, the source follower circuit may comprise an operational amplifier configured to control a voltage level at a gate of the source follower transistor based on a voltage level at a source or drain of the source follower transistor and based on the reference voltage. The voltage level at the source or drain of the source follower transistor may correspond to the voltage level at the second side of the first resistor. By doing this, the voltage level at the second side of the first resistor may be fixed to the reference voltage. As a result of this, the current through the first resistor may be proportional to the difference of the input voltage and the fixed reference voltage.

The measurement circuit may further comprise current correction circuitry configured to provide an indication of a voltage drop at the input of the current mirror circuitry. As indicated above, the current mirror circuitry may comprise an input transistor at the input. The input transistor may be used as a transistor diode. In such a case, the voltage drop at the input of the current mirror circuitry may correspond to the gate-source voltage at the transistor diode.

The voltage level at the input of the current mirror circuitry may lead to an inaccuracy for measuring the input voltage. In other words, the sensed input voltage may comprise a systematic error due to the voltage level at the input of the current mirror circuitry. The measurement circuit may comprise means for offsetting the sensed input voltage based on the indication of the voltage drop at the input of the current mirror circuitry. As a result of this, the accuracy of the sensed input voltage may be increased.

The current correction circuitry may comprise an operational amplifier with a first input being coupled to the second side of the first resistor. Furthermore, the current correction circuitry may comprise a correction transistor with a gate being controlled by an output of the operational amplifier. In addition, the current correction circuitry may comprise a correction resistor which is coupled to a source (or drain) of the correction transistor and to a second input of the operation amplifier. As a result of this a drain-source current through the correction transistor may provide an indication of the voltage drop at the input of the current mirror circuitry.

As indicated above, the measurement circuit may further comprise an analog-to-digital converter (ADC) which is configured to convert the sensed input voltage into a digital signal. The ADC may exhibit a pre-determined conversion range and the measurement circuit (notably the control circuitry of the measurement circuit) may be configured to adapt the current mirror ratio, in order to map different ranges of the input voltage to the pre-determined conversion range of the ADC.

The current mirror circuitry and the second resistor may be implemented as an integrated circuit, and (only) the first resistor may be external to the integrated circuit. As such, the measurement circuit may be implemented in a cost efficient manner. In particular, the adjustment of the current mirror ratio may be implemented in a cost efficient manner.

The current mirror circuitry may comprise a first transistor which is configured to couple the second side of the first resistor to ground, and a second transistor which is configured to couple the second resistor to ground. Furthermore, the current mirror circuitry may comprise an operational amplifier which is configured to control gates of the first transistor and of the second transistor based on a reference voltage and based on a voltage level at the second side of the first resistor. The use of such current mirror circuitry may be beneficial, as the second side of the first resistor may be set to a fixed reference voltage. By setting the second side of the first resistor (which is also referred to as the input node) to a fixed reference voltage, the voltage level at the second side of the first resistor remains unchanged, even subject to changes of the level of the input voltage. As a result of this, the influence of a capacitance at the input of the measurement circuit may be removed, thereby increasing the detection speed of the measurement circuit.

The current mirror circuitry may comprise an upper current mirror which is coupled at an input to the second side of the first resistor. The upper current mirror may be operated relative to a supply voltage of the measurement circuit. As such, the upper current mirror may be used for measuring negative input voltages. Furthermore, the current mirror circuitry may comprise a lower current mirror which is coupled at an input to the second side of the first resistor. The lower current mirror may be operated relative to ground. As such, the lower current mirror may be used for measuring positive input voltages. Consequently, the measurement circuit may be configured to measure positive and negative input voltages.

According to a further aspect, a controller for a driver circuit of a solid state lighting (SSL) device is described. The SSL device may comprise one or more light emitting diodes (LEDs). The driver circuit may comprise a power converter configured to transfer energy from an input of the driver circuit to the SSL device. The power converter may comprise an isolating or a non-isolating power converter. Alternatively or in addition, the power converter may comprise a linear regulator. By way of example, the power converter may comprise a fly-back power converter.

The energy at the input of the driver circuit may be derived from the AC mains voltage at a mains frequency. In particular, the input voltage of the power converter may be derived from a rectified version of the AC (alternating current) mains voltage (also referred to as the (rectified) input voltage). The input voltage may vary in accordance to a cycle frequency (which may be twice the frequency of the mains voltage, i.e. the cycle frequency may be twice the mains frequency). The mains frequency may correspond to 50 Hz or 60 Hz. The AC mains voltage may exhibit or may have a waveform comprising a sequence of full-waves. The full-waves may be repeated within the waveform at the mains frequency. Each full-wave may be subdivided into two-half waves.

The controller may be configured to determine a dim level for the SSL device. The dim level may be derived based on information comprised within the waveform of the AC mains voltage (e.g. based on a modulation of the waveform and/or based on a phase-cut angle). Alternatively or in addition, the dim level may be determined based on information which has been received on a separate communication channel (e.g. via Bluetooth or via Wireless LAN).

The controller may comprise the measurement circuit described in the present document (or at least parts thereof). In particular, the current mirror circuitry and the second resistor may be implemented as part of the controller. The controller (e.g. the control circuitry of the measurement circuit) may be configured to change the current mirror ratio based on (e.g. in accordance to) the mains frequency. As a result of this, different excerpts of a half wave or full wave of the mains voltage may be mapped to the pre-determined conversion range of the ADC of the measurement circuit, thereby increasing the conversion accuracy and/or reducing the ADC costs. In particular, this allows providing a highly accurate digital version of the half wave/full wave of the input voltage, while using an ADC having a conversion range which corresponds to only a fraction of the range of the half wave/full wave of the input voltage. By way of example, the half wave/full wave of the input voltage may be subdivided into Q (Q greater than 1) sections, and the current mirror ratio may be modified Q times within each half wave/full wave, in order to adapt the measurement circuit to the particular excerpt of the half wave/full wave of the input voltage.

According to a further aspect, a driver circuit for an SSL device is described, which comprises the controller and/or the measurement circuit described in the present document.

According to another aspect, an SSL device is described which comprises the controller and/or the measurement circuit described in the present document.

According to a further aspect, a method for providing a sensed input voltage indicative of an input voltage is described. The method comprises coupling a first resistor at a first side to the input voltage. Furthermore, the method comprises providing current mirror circuitry which is coupled at an input to a second side of the first resistor, which is opposite to the first side of the first resistor, and which is configured to translate an input current at the input of the current mirror circuitry into an output current at an output of the current mirror circuitry, such that the output current is proportional to the input current by a current mirror ratio. In addition, the method comprises providing the sensed input voltage using a second resistor which is coupled to the output of the current mirror circuitry.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

In the present document, a light bulb "assembly" includes all of the components required to replace a traditional incandescent filament-based light bulb, notably light bulbs for connection to the standard electricity supply. In British English (and in the present document), this electricity supply is referred to as "mains" electricity, whilst in US English, this supply is typically referred to as power line. Other terms include AC power, line power, domestic power and grid power. It is to be understood that these terms are readily interchangeable, and carry the same meaning.

Typically, in Europe electricity is supplied at 230-240 VAC, at 50 Hz and in North America at 110-120 VAC at 60 Hz. The principles set out in the present document apply to any suitable electricity supply, including the mains/power line mentioned, and a rectified AC power supply.

Figure 1:
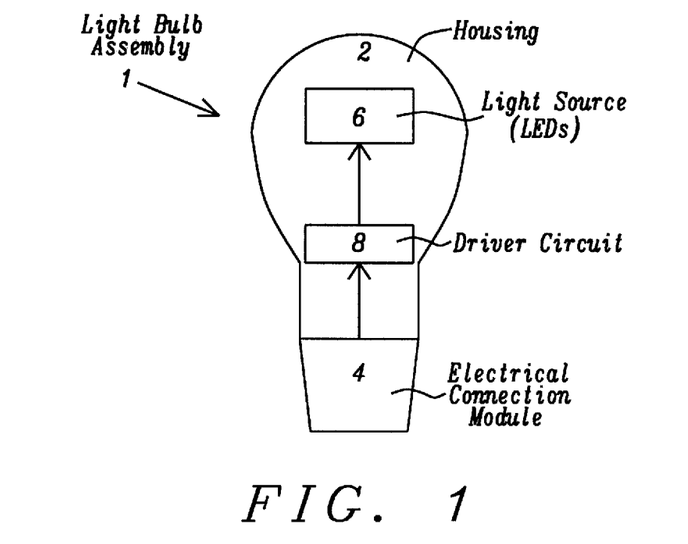
FIG. 1 illustrates a block diagram of an example light bulb assembly.

FIG. 1 is a schematic view of a light bulb assembly. The assembly 1 comprises a bulb housing 2 and an electrical connection module 4. The electrical connection module 4 can be of a screw type or of a bayonet type, or of any other suitable connection to a light bulb socket. Typical examples for an electrical connection module 4 are the E11, E14 and E27 screw types of Europe and the E12, E17 and E26 screw types of North America. Furthermore, a light source 6 (also referred to as a SSL device) is provided within the housing 2. Examples for such light sources 6 are a solid state light source or SSL device 6, such as a light emitting diode (LED) or an organic light emitting diode (OLED). The light source 6 may be provided by a single light emitting device, or by a plurality of LEDs. Typical SSL devices 6 comprise a plurality of LEDs arranged in series, such that the on-voltage $V_{on}$ of the SSL device results from the sum of on-voltages of the individual LEDs. Typical values for on-voltages of SSL devices are in the range of 100V-150V.

Usually, the voltage drop across an SSL device 6 remains substantially constant (at the on-voltage $V_{on}$ of the SSL device 6), regardless the intensity of the light emitted by the SSL device 6. The intensity of the light emitted by the SSL device 6 is typically controlled by the drive current through the SSL device 6.

Driver circuit 8 is located within the bulb housing 2, and serves to convert supply electricity (i.e. the mains supply) received through the electrical connection module 4 into a controlled drive voltage and drive current for the light source 6. In the case of a solid state light source 6, the driver circuit 8 is configured to provide a controlled direct drive current to the light source 6.

The housing 2 provides a suitably robust enclosure for the light source and drive components, and includes optical elements that may be required for providing the desired output light from the assembly. The housing 2 may also provide a heat-sink capability, since management of the temperature of the light source may be important in maximizing light output and light source life. Accordingly, the housing is typically designed to enable heat generated by the light source to be conducted away from the light source, and out of the assembly as a whole.

Figure 2A:
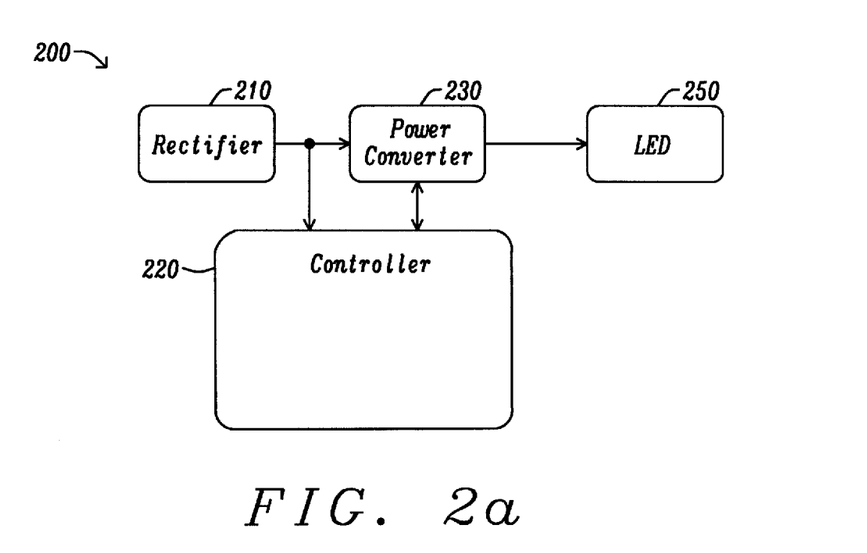
FIG. 2a shows a block diagram of example components of a driver circuit for a SSL device.

FIG. 2a illustrates example components of a driver circuit 8, 200 of an SSL device 6, 250. The driver circuit 200 comprises a rectifier 210 which receives alternating current (AC) supply electricity from the mains supply, and delivers a rectified current (DC) at its output. This DC power is received by a power converter 230 which serves to output a controlled DC drive voltage and/or a controlled drive current to the SSL device 250.

The voltage and current characteristics of the drive signal (comprising the drive voltage and the drive current) are determined by the type and number of LEDs employed in the light source 6 (i.e. in the SSL device 250). The power supplied to the SSL device 250 is controlled in dependence upon desired operating conditions of the SSL device 250. In one example, the SSL device 250 includes a plurality of LEDs connected in series, and requires a drive signal having a drive voltage of 50V or more. In general, the drive voltage may be in the range of 10V to over 100V depending on the number of LEDs comprised within the SSL device 250.

The driver circuit 200 may further comprise a controller 220 configured to control the power converter 230 to generate an appropriate drive signal (i.e. an appropriate drive voltage and an appropriate drive current) as a function of the rectified mains voltage. In particular, the controller 220 may be configured to adapt a voltage conversion ratio of the power converter 230 based on the rectified (but varying) voltage provided by the rectifier 210. The controller 220 may comprise the measurement circuit which is described in the present document, in order to provide accurate information regarding the voltage which is provided by the rectifier 210. Furthermore, the controller 220 may be configured to control the power converter 230 to provide an appropriate drive current to the SSL device 250, thereby controlling the intensity of the light emitted by the SSL device 250.

The power converter 230 may comprise an inductive energy storage device (e.g. an inductor or a transformer) and a switch device. The switch device (also referred to as a power switch) may be controlled by the controller 220, and may be provided by a metal oxide semiconductor field effect transistor (MOSFET) device, or other device suitable for switching high voltage (for example, tens of volts). It should be noted, however, that the controller 220 may comprise the switch device itself, thereby directly controlling the provisioning of an appropriate drive voltage for the SSL device 250. The power converter 230 may comprise different circuit topology. For example, the power converter 230 may comprise a buck converter circuit, a boost converter circuit, a buck/boost converter circuit, a SEPIC (single-ended primary-inductor converter) circuit, and/or a fly-back converter circuit.

Figure 2B:
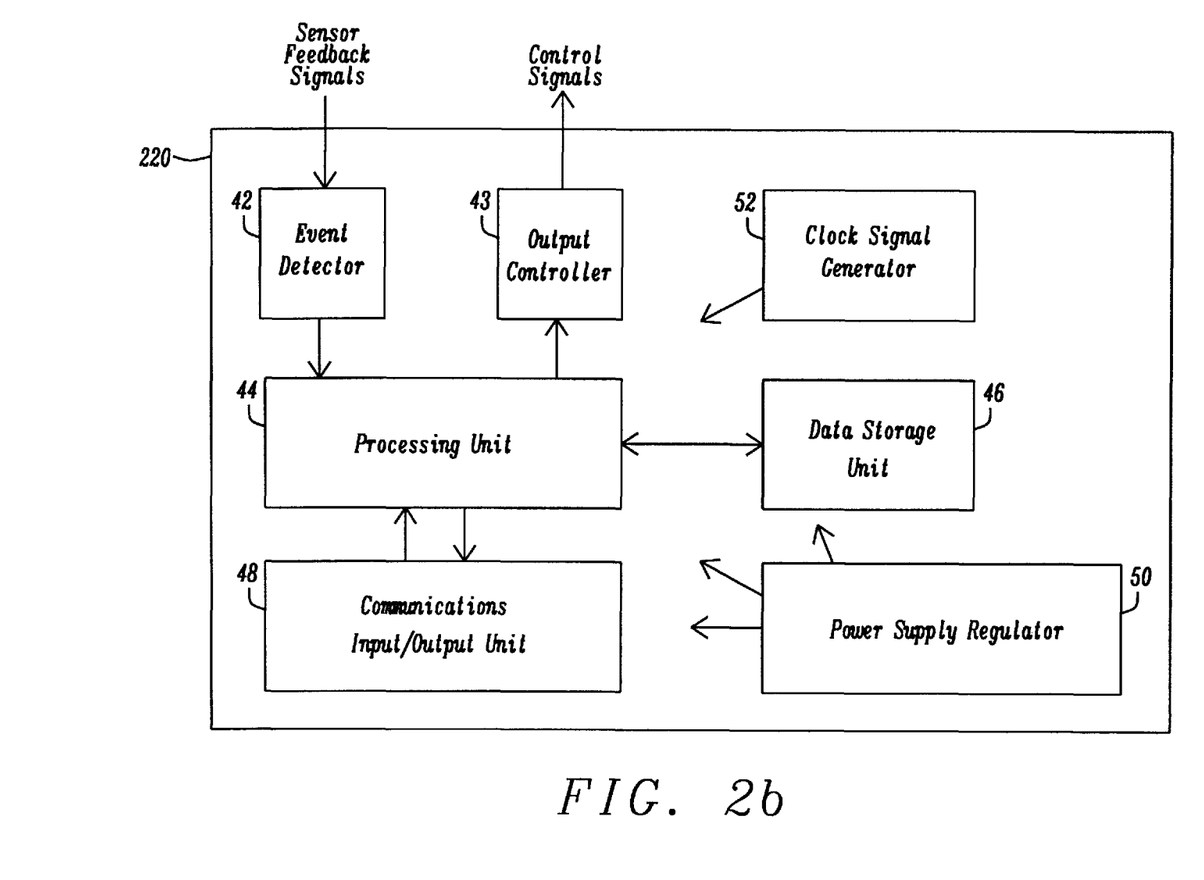
FIG. 2b shows a block diagram of example components of the controller of a driver circuit.

FIG. 2b illustrates an example block diagram of a controller 220. The controller 220 includes an event detector unit 42 connected for receiving sensor/feedback signals S (e.g. for receiving the rectified voltage provided by the rectifier 210), an output controller 43 for outputting control signals C (e.g. to the power converter 230), a processing unit 44 for overall control of the system, and a data storage unit 46 for storing data for use by the processing device. A communications input/output unit 48 may be provided for enabling the processing unit 44 to communicate with other devices, for example using a suitable wired or wireless communications protocol. The controller 220 also incorporates a power supply regulator 50, which supplies power to the devices within the controller 220, and a clock signal generator 52 (such as an oscillator circuit) for supplying a reference clock signal to the processing unit 44. The clock signal generator 52 may be configured to generate a clock signal from the sensor/feedback signals S (e.g. from the rectified voltage provided by the rectifier 210), thereby enabling a synchronization of the driver circuit 200 with the mains frequency. In other words, the clock signal generator 52 may make use of the periodicity of the mains cycle, in order to synchronize the driver circuit 200 with the mains cycle.

The processing unit 44 operates to generate the control signals C for controlling the switch device or devices in the power converter 230. Typically, the control signals are pulse-width modulated (PWM) signals that control the duty cycle (that is, the ratio of the length of an 'on-state' of the power switch over the length of a complete commutation cycle comprising an on-state phase and a succeeding off-state phase) of the switch device in the power converter 230, and hence to control the output drive voltage. In an embodiment, the controller 220 is implemented as a microcontroller or as an integrated circuit. The controller 220 may further comprise the measurement circuit described in the present document.

Figure 3:
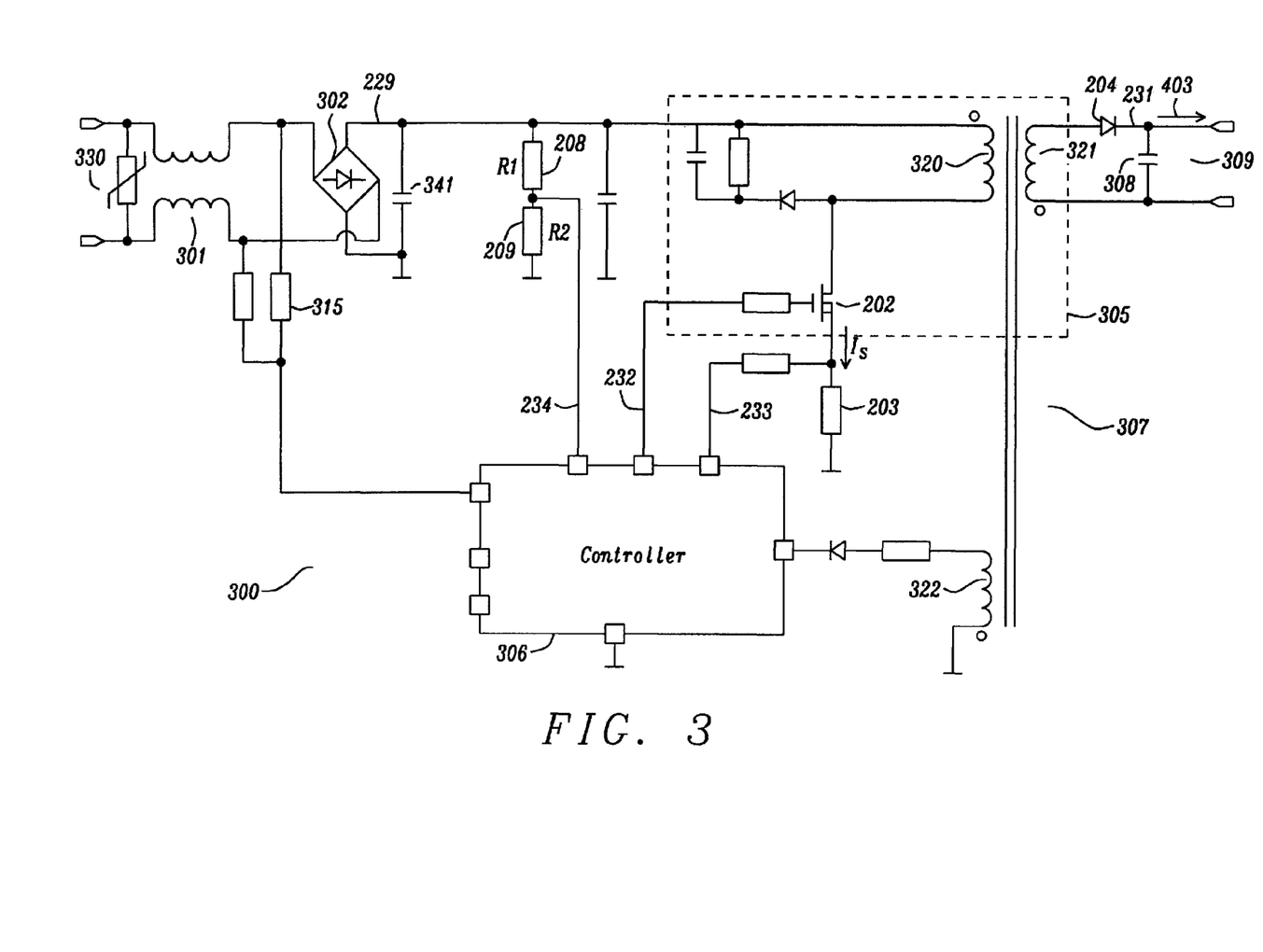
FIG. 3 illustrates a circuit diagram of an example driver circuit for a SSL device.

FIG. 3 shows a circuit diagram of an example driver circuit 300, 200, 8 of a light bulb assembly 1. The driver circuit 300 may be used to provide electrical power to a load 309, 250, 6 (which may e.g. be a light emitting diode, LED, or an LED array). The driver circuit 300 comprises an electromagnetic interference (EMI) filter unit 301 and a rectifier 302, 210, in order to generate a rectified input voltage 229 from the mains supply 330 at the capacitor 341. Furthermore, the driver circuit 300 comprises a controller 306 which is configured to control a power converter of the driver circuit 300. The controller 306 may comprise the controller 220 of FIG. 2a described above and/or the measurement circuit described in the present document. The controller 306 may be started using one or more start-up resistors 315. Furthermore, the controller 306 may be coupled to a supply voltage capacitor (not shown) configured to provide the supply voltage Vcc to the controller 306 (which may be implemented e.g. as an integrated circuit, IC). In the illustrated example, the driver circuit 300 comprises a one-stage power converter 305 comprising a fly-back converter 305. It should be noted, however, that the driver circuit 300 may comprise a multi-stage power converter. Furthermore, it should be noted that the power converter 305 may comprise other types of converters, notably isolated or non-isolated converters. The fly-back converter 305 of FIG. 3 comprises a transformer 307 having a primary coil 320 and a secondary coil 321, and having an additional auxiliary coil 322, e.g. for measurement purposes. The auxiliary coil 322 may be used to provide information to the controller 306 regarding the output voltage 231 (also referred to as the drive voltage) of the driver circuit 300. Furthermore, the driver circuit 300 may comprise an output capacitor (or storage capacitor) 308 which stores the electrical power to be provided to the light source 309. The fly-back converter 305 comprises a diode 204 which is configured to prevent a reverse energy flow from the output of the fly-back converter 305 to the input of the fly-back converter 305 during an off-state of the switch 202 of the fly-back converter 305.

The input voltage to the power converter 305 corresponds to the rectified input voltage 229. The input voltage 229 may be sensed using input voltage sensing means 208, 209, thereby providing the sensed voltage signal 234 to the controller 306. In the illustrated example, the input voltage sensing means 208, 209 are implemented using a voltage divider comprising the resistors 208, 209. Furthermore, a sensed current signal 233 is determined using current sensing means 203, and is provided to the controller 306. The sensed current signal 233 is indicative of the current through the power switch 202 of the fly-back converter 305 or of the inductor current through the primary winding 320 of the transformer 307. In the illustrated example, the current sensing means are implemented using a shunt resistor 203 which is arranged in series with the power switch 202.

The controller 306 may be configured to determine a gate control signal 232 for putting the switch 202 of the second converter stage 305 into off-state once the current Is through the switch 202 reaches a pre-determined peak current Ip. The gate control signal 232 may be determined based on the sensed current signal 233 and/or based on a freewheeling signal which may be provided e.g. by the auxiliary winding 322 of the transformer 307. In particular, the gate control signal 232 may be set to put the power switch 202 into off-state, once the sensed current signal 233 has reached a pre-determined threshold value (which is typically dependent on the pre-determined peak current Ip). Furthermore, the gate control signal 232 may be set to put the power switch 202 into on-state, once freewheeling of the primary winding 320 of the fly-back converter 305 has been detected.

The driver circuit 300 may be configured to provide a load current or SSL current 403 to the SSL device 309 for generating flicker-free light. Furthermore, the driver circuit 300 may be configured to cover a high power factor and harmonic distortion. This should also be achieved in case of dimming of the SSL device, i.e. in cases when the dimming level of the SSL device is modified.

The level of the illumination which is emitted by the SSL device 309 may be modified by modifying the average current through the SSL device 309. The average current through the SSL device 309 may be modified in an analog manner, where the level of a substantially continuous current 403 through the SSL device 309 is modified. This may be referred to as analog or linear dimming. Alternatively or in addition, the average current through the SSL device 309 may be modified by providing a pulse width modulated (PWM), substantially discontinuous, current 403 to the SSL device 309. The latter is referred to as PWM dimming. In PWM dimming, the level of the SSL current 403 is typically based on the pulse width and period of a PWM signal, while in analog dimming the level of the SSL current 403 is based on the amplitude of an analog signal.

The dim level of an SSL device 309 may be set using a dimmer within the mains supply network. The dimmer may comprise a phase-cut dimmer and/or a digital dimmer. The driver circuit 300 may be configured to determine the dim level based on the waveform of the rectified input voltage 229 (e.g. based on information which is modulated onto the waveform of the input voltage 229). Alternatively or in addition, the dim level may be communicated to the driver circuit 300 using a dedicated communication path (e.g. via Bluetooth or Wireless LAN). The driver circuit 300 may be configured to control the power converter 305 based on the dim level. In particular, the driver circuit 300 may be configured to generate a pulse width modulated SSL current 403 for reducing the average level of the SSL current 403 and for reducing the dim level of the SSL device 309.

As shown in FIG. 3, a voltage divider 208, 209 may be used for measuring the level or waveform of the (rectified) input voltage 229 of the driver circuit 300. Such a voltage divider 208, 209 typically has a fixed divider ratio. If the sensed voltage signal 234 which is provided by the voltage divider 208, 209 is measured using an ADC (Analog-to-Digital Converter), a high resolution conversion may be required to provide a reasonable accuracy for a wide range of levels of the input voltage 229 and/or for the complete waveform of the input voltage 229. By way of example, if the driver circuit 300 is to be used for 230V and for 110V input voltages 229, an ADC with a relatively high resolution is required, thereby substantially increasing the cost of the driver circuit 300. In the present document, cost efficient means are described for measuring different levels and/or complete waveforms of the input voltage 229 at high accuracy.

In particular, it is proposed to provide a voltage divider with an adjustable current mirror between the upper resistor 208 and the lower resistor 209 of the voltage divider. As a result of this, the divider ratio can be changed on-the-fly as required by the actual level of the input voltage 229. This leads to an increased resolution of an ADC for a wide range of input voltages 229. Furthermore, the use of an adjustable current mirror allows the upper resistor 208 to exhibit an increased permissible value range, thereby easing the overall system design constraints. Additionally, the described structure has an increased robustness against external voltage spikes and high energy pulses.

The use of an adjustable current mirror is well adapted to IC (Integrated Circuit) technology, wherein the lower resistor 209 may be implemented within an IC (e.g. within the controller 306). The lower resistor 209 may exhibit a fixed, trimmed value. Furthermore, current mirrors may be implemented in an efficient manner within ICs, notably when using the CMOS process, with relatively high matching accuracy.

Figure 4:
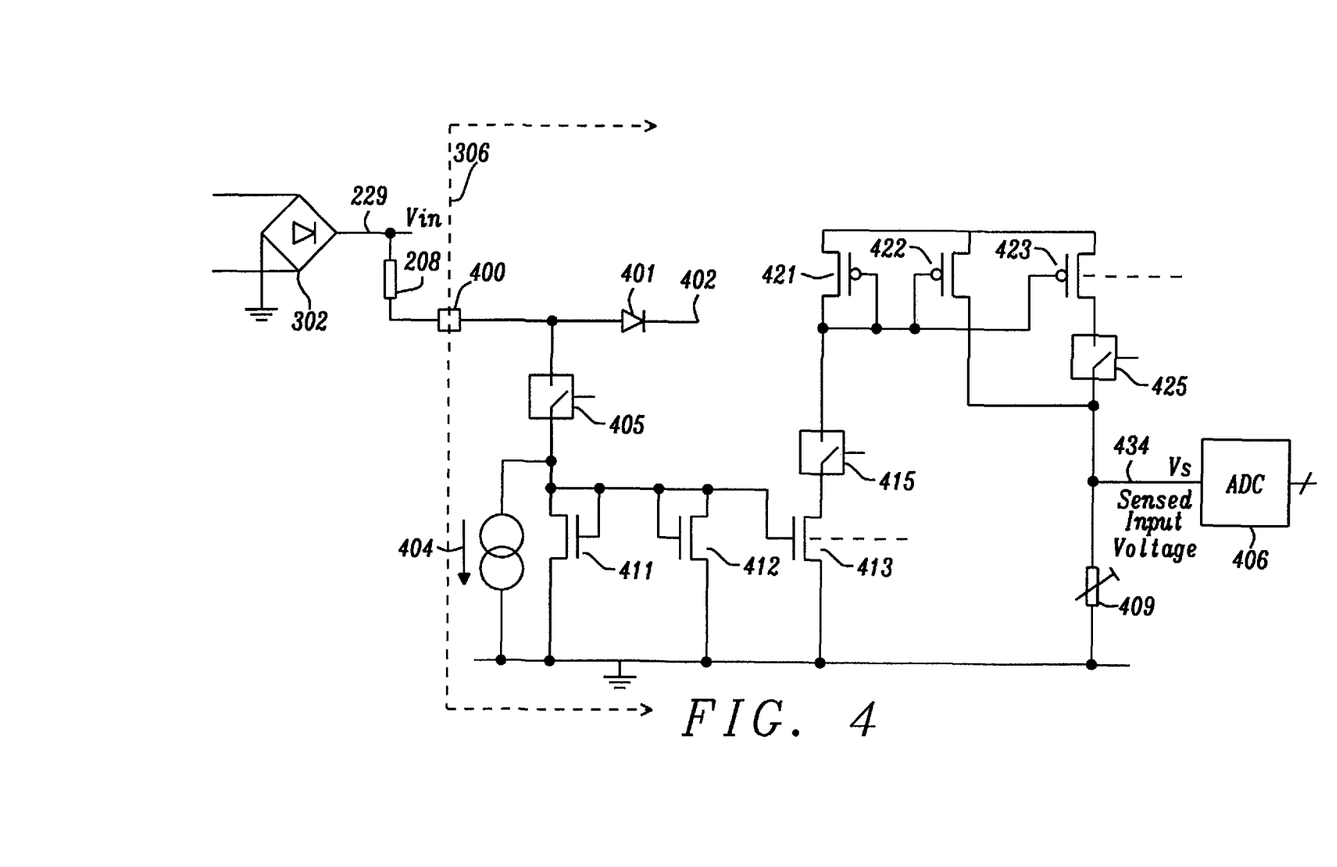
FIG. 4 shows a block diagram of example components of a controller configured to measure the level of the input voltage of the driver circuit.

FIG. 4 shows a block diagram with example components of the controller 306. The controller 306 is used herein as an example of an integrated circuit. The components used for measuring the input voltage 229 may be implemented in an integrated circuit which is separate from the controller 306. As indicated above, the upper resistor 208 may be external to the controller 306 and may be coupled to the controller 306 (or measurement circuit) via a pin 400. A first side of the upper resistor 208 may be coupled to the input voltage 229 and the opposed second side of the upper resistor 208 may be coupled to the pin 400. The lower resistor 409 may be implemented within the controller 306. The upper resistor 208 and the lower resistor 409 may be coupled to each other via a current mirror structure (also referred to herein as current mirror circuitry).

The current mirror structure of FIG. 4 comprises a first adjustable current mirror 411, 412, 413, 415 which comprises a first input transistor 411 (e.g. a NMOS transistor) and a first output transistor 412. The first mirror ratio of the first current mirror may be adjustable by providing one or more auxiliary output transistors 413 which may be activated using respective auxiliary switches 415. As such, the mirror ratio of the first current mirror may be modified.

The current mirror structure of FIG. 4 may comprise a second adjustable current mirror 421, 422, 423, 425 configured to convert the output current of the first current mirror into a current towards ground. In a similar manner to the first current mirror, the second current mirror comprises an input transistor 421 and an output transistor 422. Furthermore, the second current mirror may comprise one or more auxiliary output transistors 423 which may be arranged in parallel to the output transistor 422 using respective one or more auxiliary switches 425.

The output current of the second current mirror (i.e. the output current of the current mirror circuitry) may be provided to the lower resistor 409, such that the voltage drop at the lower resistor 409 provides a sensed input voltage 434. The sensed input voltage 434 may be provided to the ADC 406 in order to provide a digital representation of the sensed input voltage 434.

If Vin is the input voltage 229 and if Vs is the sensed input voltage 434, with R1 and R2 being the resistances of the upper resistor 208 and of the lower resistor 209, respectively, and with k1 being the mirror ratio of the first current mirror and with k2 being the mirror ratio of the second current mirror, the sensed input voltage 434 may be approximated by: $Vs=Vin*k1*k2*R2/(R1+k1*k2*R2)$. Hence, it can be seen that by adapting the mirror ratios k1 and/or k2, the sensed input voltage 434 can be maintained within a predetermined range for different levels or ranges of input voltage Vin 229.

The circuit of FIG. 4 further comprises a start-up diode 401 which may be used to provide a supply voltage Vcc to the controller 306 upon start-up of the driver circuit 300. In particular, the start-up diode 401 may be coupled to a supply voltage capacitor 402 of the driver circuit 300 (which may be coupled to a supply voltage pin of the controller 306). Hence, the upper resistor 208 may also be used as a start-up resistor, thereby removing the need for start-up resistors 315 of FIG. 3. Furthermore, the number of pins of the controller 306 may be reduced.

In addition, the circuit may comprise a current source 404 which is configured to provide an offset current. Using the offset current, the current at the input of the first current mirror 411, 412, 413, 415 may be offset in accordance to the offset current, thereby shifting the level of the sensed input voltage 434 to a different range. This may be beneficial to adapt the range of the sensed input voltage 434 to the available conversion range of the ADC 406.

Hence, current mirror circuitry may be used instead of a fixed resistor to form a voltage divider for measuring the input voltage 229. The current mirror circuitry automatically clamps the input voltage 229 to a diode drop (across the input transistor 411 which forms a transistor diode) with the external resistor 208 providing a current limit. In other words, by using current mirror circuitry, the voltage drop across the upper resistor 208 is set to the difference between the input voltage 229 and the voltage at the input of the current mirror circuitry (e.g. the gate-source voltage of the first input transistor 411). The resistance of the upper resistor 208 may be selected to be relatively high. As a result of this, a robust protection from voltage spikes, even for surge pulses (in the order of 2 kV), is provided.

As shown in FIG. 4, during start-up the external resistor 208 may be used to supply the VCC voltage to start the controller 306 in FIG. 3 and/or the SSL device. Once operating, a measurement switch 405 may be closed for enabling the measurement of the input voltage 229. The input mirror device 422 may be used to generate a current through the upper resistor 208 that is adjustable to accommodate a wide range of external resistor values and/or input voltage levels. The number of adjustment devices (i.e. the number of auxiliary transistors 413) and associated switches 415 may be used to set the range and accuracy of the allowable external resistor values and/or input voltage levels.

The current at the output of the first current mirror 411, 412, 413, 415 (also referred to as the intermediate current) may be mirrored back to a trimmed internal resistor 409 which forms the output half of the divider (also referred to as a potential divider), using the second current mirror 421, 422, 423, 425. The gain setting of the second current mirror may be achieved by using one or more auxiliary transistors 423 and associated switches 425. The second current mirror may comprise PMOS transistors. The number of gain settings may depend on the scaling and the number of devices.

The fixed internal resistor 409 may be trimmed for a fixed absolute value and can be designed to have a known temperature characteristic. As such, the temperature may be taken into account when determining the level of the input voltage 229, in order to increase the accuracy of the voltage measurement. The voltage drop at the resistor 409 may be provided as a sensed input voltage 434 for digitization to the ADC 406.

The current source 404 may be used to generate a 'zoom' area for the sensed input voltage 434 by applying a fixed voltage/current offset to the measurement. The current source 404 may also be used to discharge any external capacitance (e.g. the capacitance 341 of FIG. 3) when the measurement circuit/controller 306 is turned off.

Figure 5:
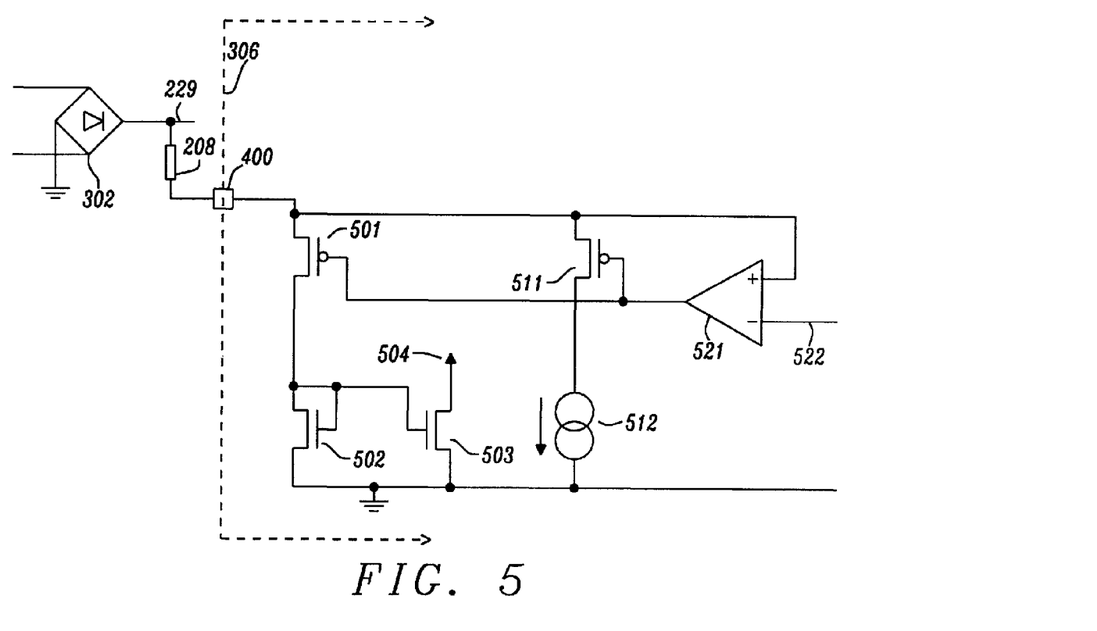
FIG. 5 shows another block diagram of example components of a controller configured to measure the level of the input voltage of the driver circuit.

FIG. 5 shows a block diagram of another circuit for measuring the input voltage 229 using e.g. the controller

306. In a similar manner to the circuit of FIG. 4, the circuit comprises a current mirror comprising an input transistor 502 and an output transistor 503 providing a current 504 at the output of the current mirror 502, 503. The sensed input voltage 434 may be determined based on the current 504 (e.g. using a second resistor 409 as shown in FIG. 4). The current mirror 502, 503 may correspond to the first current mirror 411, 412, 413, 415 of FIG. 4. The circuit may further comprise a source follower circuit 501, 511 for setting the voltage level at the pin 400 to a pre-determined reference voltage 522. The source follower circuit comprises a source follower transistor 501 and an operational amplifier 521.

Hence, the current mirror 502, 503 may be buffered using the source follower circuit 501, 521 which is controlled by operational amplifier 521 and the reference voltage 522. The source follower circuit 501, 521 maintains the device pin 400 at a constant voltage irrespective of the gate-source voltage Vgs of the input transistor 502 of the current mirror 502, 503. As a result of this, the stability of the measurement may be improved.

The circuit of FIG. 5 further comprises circuitry for providing a reference current using a current source 512 arrange in series with a second source follower 511 which is controlled using the operational amplifier 521 and the reference voltage 522. The current provided by the current source 512 may be indicative of the reference voltage 522. As such, the current provided by the current source 512 may be used to compensate the impact of the reference voltage 522 on the sensed input voltage 434 of FIG. 4.

By fixing the pin 400 to the reference voltage Vref, the sensed input voltage Vs 434 of FIG. 4 may be given by: Vs=(Vin−Vref)*k1*k2*R2/R1. It can be seen how the current mirror ratios k1 and/or k2 may be used to maintain the level of the sensed input voltage Vs 434 fixed for different level of input voltage Vin 229. As indicated above, the current provided by the current source 512 may be used to compensate the impact of the reference voltage 522 on the sensed input voltage 434, thereby providing an accurate indication of the input voltage 229.

Figure 6:
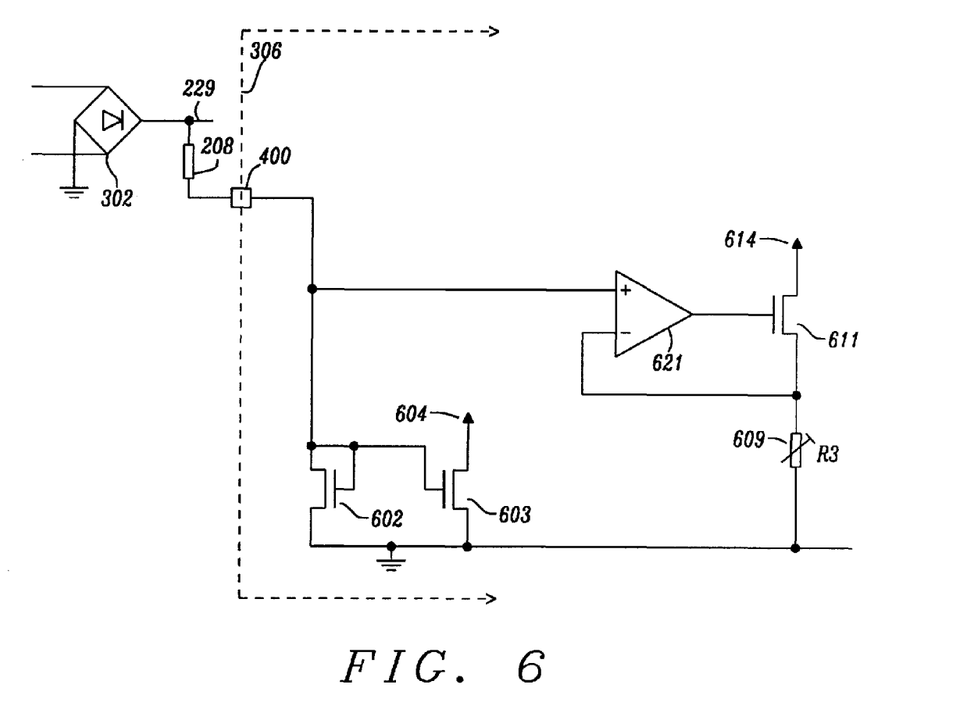
FIG. 6 shows another block diagram of example components of a controller configured to measure the level of the input voltage of the driver circuit.

FIG. 6 shows another measurement circuit for measuring the input voltage 229 which is used in combination with correction circuitry for correcting the input current at the pin 400. The measurement circuit comprises a current mirror 602, 603 comprising an input transistor 602 and an output transistor 603. The current mirror 602, 603 may correspond to the input current mirror 411, 412, 413, 415 of FIG. 4. The current mirror 602, 603 provides the output current 604 at the output transistor 603.

Furthermore, the circuit of FIG. 6 comprises current correction circuitry comprising the source follower transistor 611 which is controlled using the operational amplifier 621 and the voltage level at the pin 400. As a result of using the correction circuitry 611, 621, the voltage at the resistor 609 corresponds to the voltage at the pin 400. As a result of this, the current 614 through the source follower transistor 611 is dependent on the voltage at the pin 400, i.e. on the voltage at the input transistor 602 of the current mirror 602, 603 (i.e. on the voltage at the input of the current mirror circuitry). The resistor 609 may be trimmed to a known absolute value (similar to the lower resistor 409).

The current 604 at the output of the current mirror 602, 603 may be given by $$I1 = \frac{Vin - Vgs_{N1}}{R1},$$

wherein Vin is the input voltage 229 and wherein $Vgs_{N1}$ is the gate-source voltage at the input transistor 602 (when assuming a mirror ratio k1 of one). The gate-source voltage $Vgs_{N1}$ is typically substantially smaller than the input voltage Vin 229. The current 614 at the transistor 611 is given by $$I2 = \frac{Vgs_{N1}}{R3},$$

wherein R3 is the resistance of resistor 609.

I2 may be used to compensate the (small) error on the accuracy of the measurement of the input voltage Vin, which is caused by the gate-source voltage $Vgs_{N1}$. For this purpose, the current may be aligned with the current I1, by adjusting the value of R3 to look like the value of R1 by a current mirror ratio. Then the two currents I1 and I2 may be added together. It can be seen from the above equation that the sum of the two currents I1 and I2 provides an accurate indication of the input voltage Vin, if R1=R3.

Figure 7:
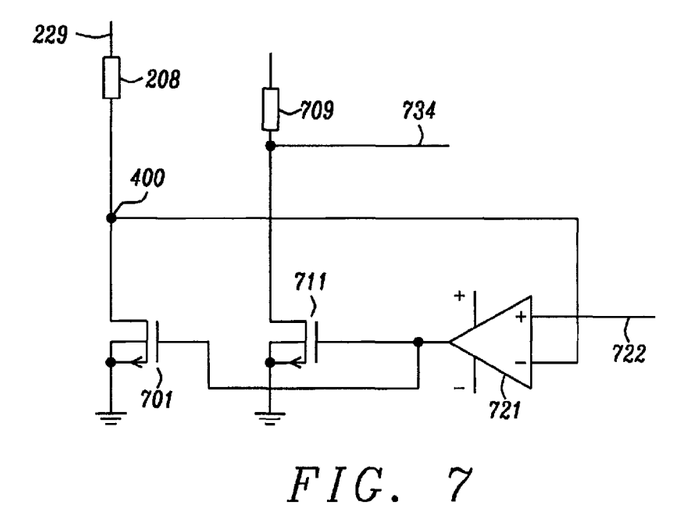
FIG. 7 shows another block diagram of example components of a controller configured to measure the level of the input voltage of the driver circuit.

FIG. 7 shows a block diagram of a further measurement circuit. In the illustrated example, the arrangement of transistors 701, 711 and of the operational amplifier 721 is used as a current mirror between the upper resistor 208 (also referred to as the first resistor) and the lower resistor 709 (also referred to as the second resistor). The operational amplifier 721 ensures that the voltage at the pin 400 is fixed to a reference voltage Vref 722, thereby providing a current through the upper resistor 208 which corresponds to (Vin−Vref)/R1. This current is mirrored to the second transistor 711 using the operational amplifier 721. A mirror ratio may be given by the size ratios of the first transistor 701 and the second transistor 711. A sensed input voltage 734 (also referred to as an indication 734 of the input voltage 229) is provided at the lower resistor 709 (relative to a pre-determined supply voltage Vcc of the controller 306).

The measurement circuit of FIG. 7 is beneficial, as it provides a precise reference due to the operational amplifier 721. In particular, by regulating the input node 400 the effect of an input capacitor may be eliminated, because the input node 400 does not change its voltage level (even subject to a change of the level of the input voltage 229). As a result of this, the speed for the detection of the level of the input voltage 229 may be increased.

Figure 9:
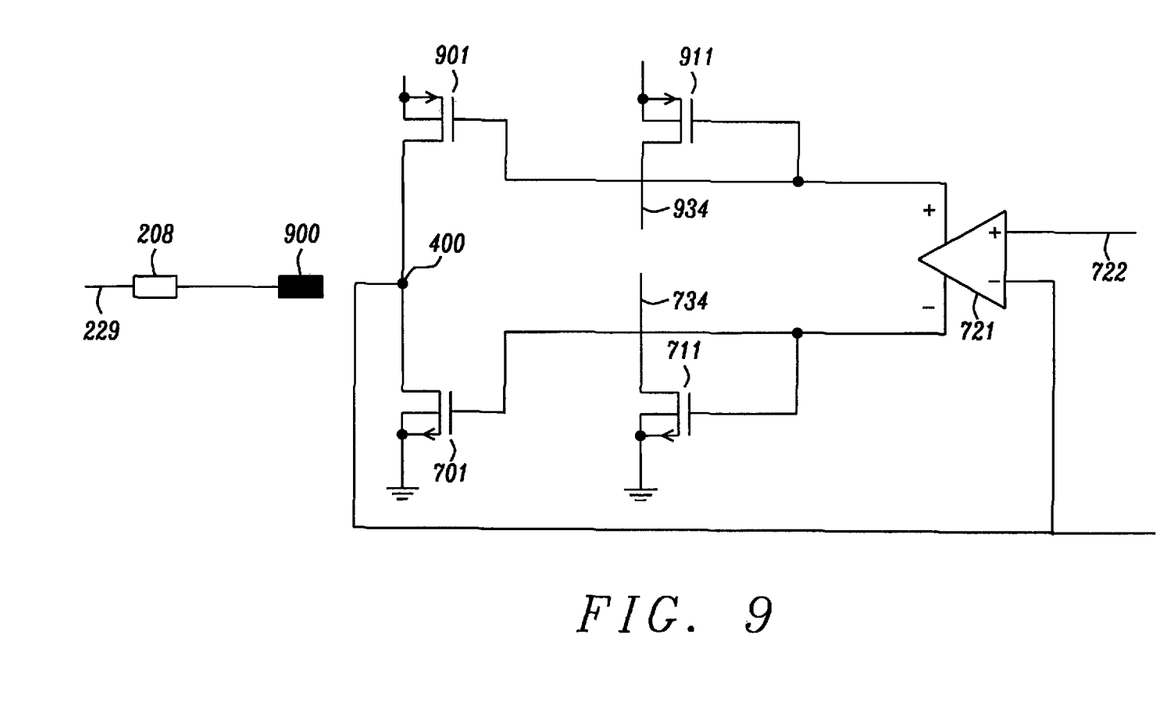
FIG. 9 shows another block diagram of example components of a controller configured to measure the level of the input voltage of the driver circuit.

The measurement circuit may be used for positive and/or negative input voltages 229. FIG. 9 illustrates a measurement circuit which is configured to operate with positive and negative input voltages 229. For measuring the input voltage 229, the pin 900 at the first resistor 208 is (directly) coupled to the input node 400. Furthermore, the input node 400 may be coupled to ground via a lower current mirror comprising the transistors 701, 711. The lower current mirror is active in case of positive input voltage 229 and provides an indication 734 of the input voltage 229 at the drain of the transistor 711. The lower current mirror is operated relative to ground.

Furthermore, the measurement circuit comprises an upper current mirror formed by the transistors 901, 911. The sources of the transistors 901, 911 are coupled to the supply voltage Vcc. As such, the upper current mirror is operated relative to the supply voltage Vcc of the measurement circuit. An indication 934 of the input voltage 229 is provided at the drain of the transistor 911 (in case of negative input voltages 229). A resistor may be coupled to the drain of the transistor 911 and the indication 934 of the input voltage 229 may correspond to or may depend on a voltage drop at the resistor.

Using the measurement circuits described in the present document, input voltages 229 in a relatively large voltage range may be measured. By regulating the voltage level of the input node 400 to a predetermined reference voltage 722, the input node 400 does not modulate, even subject to a change of the input voltage 229. As a result of this, a capacitance at the input of the measurement circuit does not have any influence on the dynamics of the voltage measurement.

Figure 8:
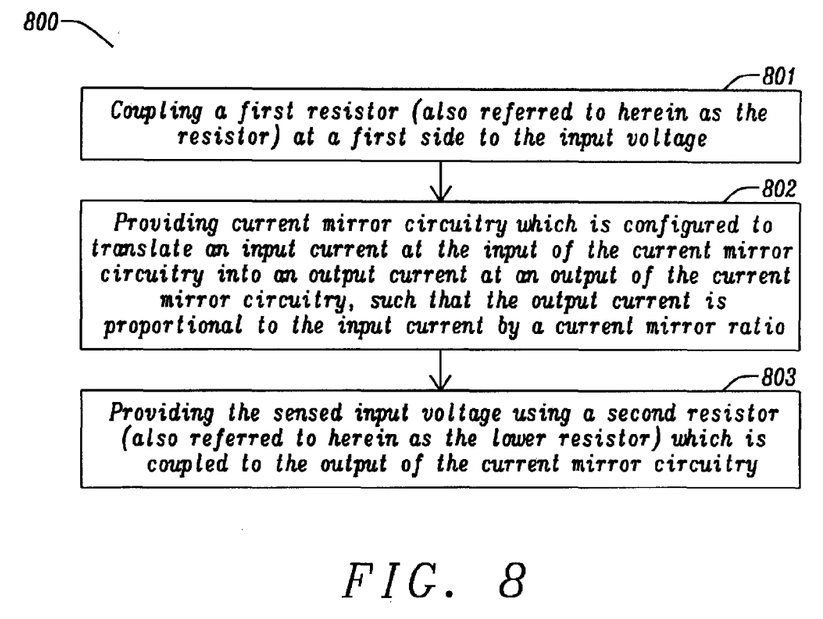
FIG. 8 shows a flow chart of an example method for measuring the input voltage of a driver circuit.

FIG. 8 shows a flow chart of an example method 800 for providing a sensed input voltage 434 which is indicative of the input voltage 229. The method 800 comprises coupling 801 a first resistor 208 (also referred to herein as the upper resistor) at a first side to the input voltage 229. Furthermore, the method 800 comprises providing 802 current mirror circuitry 411, 412, 413, 415, 421, 422, 423, 425 which is coupled at an input to a second side of the first resistor, which is opposite to the first side of the first resistor. The current mirror circuitry is configured to translate an input current at the input of the current mirror circuitry into an output current at an output of the current mirror circuitry, such that the output current is proportional to the input current by a current mirror ratio. In addition, the method 800 comprises providing 803 the sensed input voltage 434 using a second resistor 409 (also referred to herein as the lower resistor) which is coupled to the output of the current mirror circuitry.

The measurement circuits described in the present document provide various benefits. The described measurement circuits allow the external resistor value to be accommodated over a wide range of values, compared with a single optimized value of a temperature compensated adjustable internal resistor. The measurement circuits allow for a substantial difference between the start-up current and the measurement range. The internal adjustable resistor 409 may be optimized in the layout of an IC for temperature stabilization. A gain change of the first and/or second current mirrors may be achieved on-the-fly, e.g. for an adjustment between 230V to 110V and/or for an adjustment along the waveform of an AC mains voltage. In addition, the voltage measurements circuits may be used for digital dimmer data extraction, as they allow for accurate peak mains voltage measurement.

Furthermore, the described circuits allow limiting the input voltage 229 to low values during high-voltage transients. The sensed input voltage 434 at the output of the measurement circuit may be well protected, and may be directly connected to the internal circuitry of the controller 306, e.g. to an ADC 406 and or sample and hold circuit. The measurement circuits are extremely robust to ESD or transient voltage spikes and parasitic capacitance at the input pin 400 of the IC. A current source 404 may be used to generate an additional zoom area and/or to generate a pull down for discharging parasitic capacitors. The current source 404 may be an adjustable current source related to the measured current, in order to correct the voltage error at the input pin 400 (due to the gate-source voltage at the input transistor 411 of the current mirror).

It should be noted that while the circuits have been described using CMOS technology, the circuits may also be provided in conjunction with other technologies such as bipolar, BCD, etc.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A measurement circuit configured to provide a sensed input voltage indicative of an input voltage, wherein the measurement circuit comprises
   a first resistor which is configured to be coupled at a first side to the input voltage;
   current mirror circuitry coupled at an input to a second side of the first resistor, which is opposite to the first side of the first resistor, and configured to translate an input current at the input of the current mirror circuitry into an output current at an output of the current mirror circuitry, such that the output current is proportional to the input current by a current mirror ratio;
   a second resistor coupled to the output of the current mirror circuitry and configured to provide the sensed input voltage, when the input voltage is coupled to the first side of the first resistor; and
   a source follower circuit arranged between the second side of the first resistor and the input of the current mirror circuitry; wherein the source follower circuit is configured to set a voltage level of the second side of the first resistor to a pre-determined reference voltage.

2. The measurement circuit of claim 1, wherein the current mirror ratio is adjustable.

3. The measurement circuit of claim 1, wherein the current mirror circuitry comprises a current mirror with an input transistor; an output transistor; an auxiliary transistor; and an auxiliary switch; wherein
   the auxiliary transistor is arranged in series with the auxiliary switch;
   the serial arrangement of the auxiliary switch and the auxiliary transistor are arranged in parallel to the input transistor or the output transistor, when the auxiliary switch is closed; and
   the measurement circuit is configured to control the auxiliary switch to adjust the current mirror ratio.

4. The measurement circuit of claim 1, further comprising an offset current source configured to provide an offset current; wherein the input current at the input of the current mirror circuitry is dependent on a current through the first resistor and on the offset current.

5. The measurement circuit of claim 1, wherein the current mirror circuitry comprises
   a first current mirror configured to translate the input current into an intermediate current using a first ratio; and
   a second current mirror configured to translate the intermediate current into the output current using a second ratio; wherein the current mirror ratio depends on the first ratio and on the second ratio.

6. The measurement circuit of claim 1, wherein the current mirror circuitry comprises
   an upper current mirror coupled at an input to the second side of the first resistor; wherein the upper current mirror is operated relative to a supply voltage of the measurement circuit; and a lower current mirror coupled at an input to the second side of the first resistor; wherein the lower current mirror is operated relative to ground.

7. The measurement circuit of claim 1, wherein the source follower circuit comprises
a source follower transistor arranged between the second side of the first resistor and the input of the current mirror circuitry; and
an operational amplifier configured to control a voltage level at a gate of the source follower transistor based on a voltage level at a source of the source follower transistor and based on the reference voltage.

8. The measurement circuit of claim 1, further comprising correction circuitry configured to provide an indication of a voltage drop at the input of the current mirror circuitry; wherein the correction circuitry comprises
an operational amplifier with a first input being coupled to the second side of the first resistor;
a correction transistor with a gate being controlled by an output of the operational amplifier;
a correction resistor coupled to a source of the correction transistor and to a second input of the operation amplifier; wherein a drain-source current through the correction transistor provides an indication of the voltage drop at the input of the current mirror circuitry.

9. The measurement circuit of claim 8, further comprising means for offsetting the sensed input voltage based on the indication of the voltage drop at the input of the current mirror circuitry.

10. The measurement circuit of claim 1, further comprising an analog-to-digital converter configured to convert the sensed input voltage into a digital signal.

11. The measurement circuit of claim 1, wherein the current mirror circuitry and the second resistor are implemented as an integrated circuit, and wherein the first resistor is external to the integrated circuit.

12. The measurement circuit of claim 1, wherein the current mirror circuitry comprises
a first transistor configured to couple the second side of the first resistor to ground;
a second transistor configured to couple the second resistor to ground;
an operational amplifier configured to control gates of the first transistor and of the second transistor based on a reference voltage and based on a voltage level at the second side of the first resistor.

13. A method for providing a sensed input voltage indicative of an input voltage, wherein the method comprises
coupling a first resistor at a first side to the input voltage;
providing current mirror circuitry coupled at an input to a second side of the first resistor, which is opposite to the first side of the first resistor, to translate an input current at the input of the current mirror circuitry into an output current at an output of the current mirror circuitry, such that the output current is proportional to the input current by a current mirror ratio;
providing the sensed input voltage using a second resistor which is coupled to the output of the current mirror circuitry;
setting a voltage level of the second side of the first resistor to a pre-determined reference voltage using a source follower circuit arranged between the second side of the first resistor and the input of the current mirror circuitry.

14. The method for providing a sensed input voltage indicative of an input voltage of claim 13, wherein the current mirror ratio is adjustable.

15. The method for providing a sensed input voltage indicative of an input voltage of claim 13, wherein the current mirror circuitry comprises a current mirror with an input transistor; an output transistor; an auxiliary transistor; and an auxiliary switch; further comprising the steps of:
arranging the auxiliary transistor in series with the auxiliary switch;
arranging the serial arrangement of the auxiliary switch and the auxiliary transistor in parallel to the input transistor or the output transistor, when the auxiliary switch is closed; and
controlling the auxiliary switch to adjust the current mirror ratio.

16. The method for providing a sensed input voltage indicative of an input voltage of claim 13, further comprising the step of:
arranging an offset current source to provide an offset current; wherein the input current at the input of the current mirror circuitry is dependent on a current through the first resistor and on the offset current.

17. The method for providing a sensed input voltage indicative of an input voltage of claim 13, further comprises the steps of:
providing a first current mirror configured to translate the input current into an intermediate current using a first ratio; and
providing a second current mirror to translate the intermediate current into the output current using a second ratio; wherein the current mirror ratio depends on the first ratio and on the second ratio.

18. The method for providing a sensed input voltage indicative of an input voltage of claim 13, further comprises the steps of:
coupling an upper current mirror at an input to the second side of the first resistor; wherein the upper current mirror is operated relative to a supply voltage of the measurement circuit; and
coupling a lower current mirror at an input to the second side of the first resistor; wherein the lower current mirror is operated relative to ground.

19. The method for providing a sensed input voltage indicative of an input voltage of claim 13, further comprises the steps of:
arranging a source follower transistor between the second side of the first resistor and the input of the current mirror circuitry; and
arranging an operational amplifier to control a voltage level at a gate of the source follower transistor based on a voltage level at a source of the source follower transistor and based on the reference voltage.

20. The method for providing a sensed input voltage indicative of an input voltage of claim 13, further comprising the step of:
arranging correction circuitry to provide an indication of a voltage drop at the input of the current mirror circuitry;
coupling an operational amplifier with a first input to the second side of the first resistor;
controlling a correction transistor with a gate by an output of the operational amplifier;
coupling a correction resistor to a source of the correction transistor and to a second input of the operation amplifier; wherein a drain-source current through the correction transistor provides an indication of the voltage drop at the input of the current mirror circuitry.

21. The method for providing a sensed input voltage indicative of an input voltage of claim 20, further comprising the step of:
- offsetting the sensed input voltage based on the indication of the voltage drop at the input of the current mirror circuitry.

22. The method for providing a sensed input voltage indicative of an input voltage of claim 13, further comprising the step of:
- providing an analog-to-digital converter configured to convert the sensed input voltage into a digital signal.

23. The method for providing a sensed input voltage indicative of an input voltage of claim 13, further comprising the step of:
- implementing the current mirror circuitry and the second resistor as an integrated circuit, and wherein the first resistor is external to the integrated circuit.

24. The method for providing a sensed input voltage indicative of an input voltage of claim 13, further comprising the steps of:
- coupling a first transistor to the second side of the first resistor to ground;
- coupling a second transistor to the second resistor to ground;
- controlling gates of the first transistor and of the second transistor based on a reference voltage and based on a voltage level at the second side of the first resistor with an operational amplifier.

\* \* \* \* \*